(12) United States Patent
Kitaura et al.

(10) Patent No.: US 11,476,399 B2
(45) Date of Patent: Oct. 18, 2022

(54) JOINTING MATERIAL, FABRICATION METHOD FOR SEMICONDUCTOR DEVICE USING THE JOINTING MATERIAL, AND SEMICONDUCTOR DEVICE

(71) Applicant: Panasonic Intellectual Property Management Co., Ltd., Osaka (JP)

(72) Inventors: Hidetoshi Kitaura, Osaka (JP); Akio Furusawa, Osaka (JP); Kiyohiro Hine, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/196,785

(22) Filed: Nov. 20, 2018

(65) Prior Publication Data
US 2019/0165234 A1   May 30, 2019

(30) Foreign Application Priority Data

Nov. 29, 2017 (JP) .............................. JP2017-229234
Jul. 31, 2018 (JP) .............................. JP2018-144143

(51) Int. Cl.
*H01L 33/64* (2010.01)
*H01L 33/00* (2010.01)
(Continued)

(52) U.S. Cl.
CPC .......... *H01L 33/641* (2013.01); *B23K 35/262* (2013.01); *H01L 24/27* (2013.01); *H01L 24/29* (2013.01); *H01L 24/83* (2013.01); *H01L 33/005* (2013.01); *H01L 33/644* (2013.01); *H01L 24/05* (2013.01); *H01L 24/32* (2013.01); *H01L 24/48* (2013.01); *H01L 2224/04026* (2013.01); *H01L 2224/05073* (2013.01); *H01L 2224/05644* (2013.01); *H01L 2224/05655* (2013.01);
(Continued)

(58) Field of Classification Search
CPC ... H01L 33/641; H01L 33/005; H01L 33/644; H01L 2933/0075
See application file for complete search history.

(56) References Cited

U.S. PATENT DOCUMENTS 3,361,561 A   1/1968  Pinter
3,484,210 A   12/1969 Pinter
(Continued)

FOREIGN PATENT DOCUMENTS

CN   1907636      2/2007
CN   101379618    3/2009
(Continued)

OTHER PUBLICATIONS

Partial European Search Report dated May 3, 2019 in corresponding European Patent Application No. 18208056.4.
(Continued)

*Primary Examiner* — Fernando L Toledo
*Assistant Examiner* — Neil R Prasad
(74) *Attorney, Agent, or Firm* — Wenderoth, Lind & Ponack, L.L.P.

(57) ABSTRACT

A jointing material includes: at least one type of element at 0.1 wt % to 30 wt %, the element being capable of forming a compound with each of tin and carbon; and tin at 70 wt % to 99.9 wt % as a main component.

8 Claims, 2 Drawing Sheets

(51) Int. Cl.
H01L 23/00 (2006.01)
B23K 35/26 (2006.01)

(52) U.S. Cl.
CPC ............... *H01L 2224/27849* (2013.01); *H01L 2224/29111* (2013.01); *H01L 2224/32225* (2013.01); *H01L 2224/48229* (2013.01); *H01L 2224/73265* (2013.01); *H01L 2224/83048* (2013.01); *H01L 2224/83097* (2013.01); *H01L 2224/83192* (2013.01); *H01L 2224/83399* (2013.01); *H01L 2224/83493* (2013.01); *H01L 2224/83815* (2013.01); *H01L 2924/12041* (2013.01); *H01L 2924/15763* (2013.01); *H01L 2933/0075* (2013.01)

(56) References Cited

U.S. PATENT DOCUMENTS

| | | | | |
|---|---|---|---|---|
| 5,358,880 | A * | 10/1994 | Lebby | H01L 33/0066 257/E33.069 |
| 6,231,693 | B1 | 5/2001 | Lugscheider et al. | |
| 2004/0169451 | A1 | 9/2004 | Oishi et al. | |
| 2006/0106192 | A1 * | 5/2006 | Xia | C08K 3/08 528/298 |
| 2007/0004091 | A1 | 1/2007 | Tamagawa et al. | |
| 2007/0142511 | A1 * | 6/2007 | Crawford | C08K 5/523 524/115 |
| 2007/0182006 | A1 | 8/2007 | Amagai | |
| 2007/0228109 | A1 * | 10/2007 | Smith | B23K 35/262 228/176 |
| 2008/0293231 | A1 * | 11/2008 | Goshonoo | H01L 33/405 438/605 |
| 2009/0050909 | A1 * | 2/2009 | Chen | H01L 33/20 257/88 |
| 2011/0198755 | A1 | 8/2011 | Maeda et al. | |
| 2012/0056234 | A1 * | 3/2012 | Lee | H01L 33/641 257/99 |
| 2014/0256539 | A1 * | 9/2014 | Takei | C08G 77/38 502/170 |
| 2018/0033761 | A1 | 2/2018 | Watanabe et al. | |
| 2018/0102464 | A1 * | 4/2018 | de Avila Ribas | B23K 1/0016 |
| 2018/0158991 | A1 * | 6/2018 | Shioji | H01L 33/46 |
| 2019/0019911 | A1 * | 1/2019 | Hardin | H01L 31/044 |
| 2019/0382872 | A1 * | 12/2019 | Alabort Martinez | C22C 14/00 |

FOREIGN PATENT DOCUMENTS

| | | |
|---|---|---|
| CN | 102196881 | 9/2011 |
| EP | 1 080 824 | 3/2001 |
| EP | 1 106 301 | 6/2001 |
| EP | 3 335 828 | 6/2018 |
| JP | 63-40775 | 2/1988 |
| JP | 2004-265986 | 9/2004 |
| JP | 2007-12830 | 1/2007 |
| WO | 2007/092762 | 8/2007 |
| WO | 2011/068301 | 6/2011 |
| WO | 2014/052282 | 4/2014 |
| WO | 2015/004467 | 1/2015 |
| WO | 2016/186985 | 11/2016 |
| WO | 2017/047289 | 3/2017 |

OTHER PUBLICATIONS

Kolenak R et al: "Research of Joining Brittle Nonmetallic Materials with an Active Solder", Advances in Materials Science and Engineering, vol. 2014, 729135, Dec. 22, 2014, XP055580288, ISSN: 1687-8434, DOI: 10.1155/2014/729135.

Liu C et al: "Thermodynamic Assessment of the Sn—Ti System", Monatshefte Für Chemie—Chemical Monthly, Springer-Verlag, AT, vol. 136, No. 11, Nov. 14, 2005, pp. 1921-1930, XP019378719, ISSN: 1434-4475, DOI: 10.1007/S00706-005-0392-X.

First Office Action dated Aug. 3, 2020 in corresponding Chinese Application No. 201811422049.0, with English translation.

European Official Communication pursuant to Article 94(3) EPC dated Apr. 9, 2020 in corresponding European Application No. 18208056.4.

"Significant figures", Wikipedia, Oct. 27, 2017, Retrieved from the Internet: URL: https://en.wikipedia.org/w/index.php?title=Significant figures &oldid=807345766, 4 pages.

Office Action dated Mar. 12, 2021 in Chinese Patent Application No. 201811422049.0, with English-language translation.

Third Office Action dated Aug. 19, 2021 in Chinese Application No. 201811422049.0, with English translation.

Rejection Decision dated Dec. 15, 2021, in corresponding Chinese Patent Application No. 201811422049.0, with partial English translation.

Notice of Reasons for Refusal dated Oct. 5, 2021, in corresponding Japanese Application No. 2018-144143, with English translation.

* cited by examiner

JOINTING MATERIAL, FABRICATION METHOD FOR SEMICONDUCTOR DEVICE USING THE JOINTING MATERIAL, AND SEMICONDUCTOR DEVICE

CROSS-REFERENCE TO RELATED APPLICATIONS

This application claims priorities of Japanese Patent Application No. 2017-229234 filed on Nov. 29, 2017 and Japanese Patent Application No. 2018-144143 filed on Jul. 31, 2018, the contents of which are incorporated herein by reference.

BACKGROUND OF THE INVENTION

(1) Field of the Invention

The present invention relates to a jointing material that is connectable to a heat spreader, a heatsink, and the like to cool down a semiconductor whose amount of heat generation is large such as gallium nitride, a semiconductor device using the jointing material, and a fabrication method for a semiconductor device using the jointing material.

(2) Description of the Related Art

Gallium nitride to be a compound semiconductor is widely used as a material of a high luminance light emitting element. A light emitting diode (LED) using gallium nitride has advantages such as a long operating life, low power consumption, high-speed responsiveness, and a small footprint compared to an incandescent lamp, and is rapidly prevailing. To realize further higher luminance, an increase of the driving current is effective while the amount of heat generation of the light emitting element is also increased and a cooling mechanism is necessary therefor. The light emitting element is therefore bonded or jointed to a base having an excellent heat dissipation property using a heat-dissipating sheet, a silver paste, or a solder alloy, as shown in Japanese Laid-Open Patent Publication No. 2004-265986.

FIG. 3 is a schematic diagram of a traditional semiconductor device 301. A light emitting element 302 is bonded to a base 303 of a copper alloy having thermal conductivity, using a silver paste 304. An electrode 305 is formed on the surface of the base 303, and the light emitting element 302 and the electrode 305 are connected to each other by a wire 306 to thereby establish an electric connection therebetween. The circumference of the light emitting element 302 and the wire 306 is sealed by a sealing resin 307.

In the traditional semiconductor device 301, the light emitting element 302 is bonded to the base 302 by the silver paste 304 to which silver having a high thermal conductivity coefficient is added as a filler, and the heat generated from the light emitting element 302 is efficiently dissipated to the base 303.

SUMMARY

In general, the silver paste has a thermal conductivity coefficient of about 30 W/m·k and the copper alloy has a thermal conductivity coefficient of about 400 W/m·K. In the case described in Japanese Laid-Open Patent Publication No. 2004-265986 where the jointing to the base of the copper alloy is conducted using the silver paste, because the thermal conductivity coefficient of the silver paste is not so large, the temperature of the light emitting element is increased as the driving current is increased to realize the higher luminance, and a problem therefore arises that the light emitting efficiency is degraded.

Cracks are generated in the interface after a reliability test due to migration of silver, sulfurization, thermal degradation of the paste resin, and the like by using the silver paste, and a problem arises that the heat dissipation property is degraded.

The research and development have recently been advanced for a solder alloy that includes tin having a high heat dissipation property as its main component, as a lead-free solder. With a solder alloy including tin as its main component, no sufficient reliability has however not yet acquired so far.

One non-limiting and exemplary embodiment provides a jointing material that includes a solder alloy including as its main component tin that has a high heat dissipation property and high reliability.

In one general aspect, the techniques disclosed here feature: a jointing material comprising:

at least one type of element at 0.1 wt % to 30 wt %, the element being capable of forming a compound with each of tin and carbon; and tin at 70 wt % to 99.9 wt % as a main component.

"At least one type of element capable of forming a compound with each of tin and carbon (a compound forming element)" herein refers to an optional element that forms a compound with each of tin and carbon. When two or more types of compound forming element are present, a "content rate (wt %) of the compound forming element in a jointing material" indicates the rate of the sum of the weights of the two or more types of compound forming element included in the jointing material relative to the total weight of the jointing material.

The "main component" herein means an element that has the highest abundance ratio of those of the elements included in the jointing material.

In a jointing material of an embodiment, the compound forming elements may include at least one of titanium, zirconium, and vanadium.

As to a manufacture method for a jointing article of an embodiment, a semiconductor device is provided by jointing a light emitting element and a base to each other using the jointing material of the embodiment.

According to the jointing material of the present invention, a light emitting element can be jointed to a carbon base that has a high thermal conductivity coefficient. In addition, a semiconductor device can be provided that can secure a high heat dissipation property by maintaining a high thermal conductivity coefficient based on high-temperature and high-humidity resistance of the jointing material.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF DRAWINGS

The present disclosure will become readily understood from the following description of non-limiting and exemplary embodiments thereof made with reference to the accompanying drawings, in which like parts are designated by like reference numeral and in which.

DETAILED DESCRIPTION

Figure 1A:
FIG. 1A is a schematic diagram of a step of a fabrication method for a semiconductor device according to a first embodiment.

A jointing material according to a first aspect includes:

at least one type of element at 0.1 wt % to 30 wt %, the element being capable of forming a compound with each of tin and carbon; and tin at 70 wt % to 99.9 wt % as a main component.

Further, as a jointing material of a second aspect, in the first aspect, the jointing material comprises the element at 0.1 wt % to 10 wt %.

Further, as a jointing material of a third aspect, in the first aspect or second aspect, the at least one type of element is an element that is more easily oxidized than tin.

Further, as a jointing material of a fourth aspect, in the any one aspect of first to third aspects, a melting point of a compound of the element with tin is 1,000° C. or higher.

Further, as a jointing material of a fifth aspect, in the any one aspect of first to fourth aspects, the at least one type of element comprises at least one selected from the group consisting of titanium, zirconium, and vanadium.

A fabrication method for a semiconductor device according to a sixth aspect includes:

providing a jointing material according to any one aspect of the first to fifth aspect; and jointing a light emitting element and a carbon base to each other using the jointing material to fabricate a semiconductor device.

A semiconductor device according to a seventh aspect includes:

a light emitting element;

a carbon base; and the jointing material according to any one aspect of the first to fifth aspects, the jointing material jointing the light emitting element and the carbon base to each other.

Further, a semiconductor device of a eighth aspect, in the seventh aspect, the jointing material comprises the element at a content rate higher than 5 wt % and 10 wt % or lower.

A jointing material according to an embodiment will be described with reference to the accompanying drawings. In the drawings, substantially same members are given the same reference numerals.

First Embodiment

Jointing Material

A jointing material according to a first embodiment is an alloy that includes an element at 0.1 wt % to 30 wt %, the element being capable of forming a compound with each of tin and carbon (that is, the element is referred as "compound forming element") and, tin at 70 wt % to 99.9 wt % as its main component.

The compound forming element forms a compound with each of tin and carbon, and is not especially limited only when the compound forming element is an element that is more easily oxidized than tin.

Table 1 is a table of examples of the compounds of each element to be a compound forming element with each of tin, carbon, and oxygen, and the standard Gibbs energy of formation of each of the oxides. The chemical formulae of the compounds however are exemplification and do not represent all the compounds.

TABLE 1

| Name of Element | Compound with Sn | Melting Point of Compound with Sn (° C.) | Compound with C | Oxide | Standard Gibbs Energy of Formation (kJ/mol) |
|---|---|---|---|---|---|
| Ti | $Ti_5Sn_6$ | 1,490 | TiC | $Ti_4O_7$ | −3,213 |
| Y | $Sn_3Y_5$ | 515 | $Y_2C$ | $Y_2O_3$ | −1,817 |
| Nb | $NbSn_2$ | 920 | $Nb_2C$ | $Nb_2O_3$ | −1,766 |
| Pr | $PrSn_3$ | 1,180 | $Pr_2C_3$ | $Pr_2O_3$ | −10,674 |
| La | $LaSn_3$ | 1,147 | $La_2C_3$ | $LaO_3$ | −1,706 |
| V | $Sn_3V_2$ | 1,500 | $V_2C$ | $V_2O_5$ | −1,420 |
| Mn | $MnSn_2$ | 549 | $Mn_{23}C_6$ | $Mn_3O_4$ | −1,283 |
| Th | $ThSn_3$ | 955 | ThC | $ThO_2$ | −1,169 |
| Fe | FeSn | 513 | $Fe_3C$ | $Fe_2O_3$, $Fe_3O_4$ | −1,016 |
| Zr | $ZrSn_2$ | 1,142 | ZrC | $ZrO_2$ | −1,043 |
| Mo | $MoSn_2$ | 800 | MoC | $MoO_3$ | −668 |
| Li | $Li_2Sn_5$ | 326 | $C_6Li$ | $Li_2O_2$ | −572.7 |
| Sn | — |  | — | $SnO_2$ | −515.7 |

As shown in Table 1, examples of the element capable of forming a compound with each of tin and carbon (the compound forming element) include, for example, Ti, Y, Nb, Pr, La, V, Mn, Th, Fe, Zr, Mo, and Li. These elements each form a compound with each of both of tin and carbon and, because the standard Gibbs energy of formation of each of the oxides of these elements is lower than that of the oxide of tin, these elements each more easily form an oxide than tin does even when these elements are each present with tin. The compound forming elements may include at least one selected from the group consisting of titanium, zirconium, and vanadium.

The reason why titanium, zirconium, and vanadium are selected is that the melting point of each of the compounds with Sn is high as shown in Table 1 (including the melting points are added). The strength of the jointing material is maintained for a longer term as the melting point is higher. The melting point of the compound only has to be at least 1,000° C. or higher.

The compound in a sufficient amount can be formed in the interface between the jointing material and the carbon base and an excellent jointing layer having high strength can be formed in the interface between the carbon base and the jointing material by the fact that the content of the compound forming element of the jointing material is 0.1 wt % or higher.

The content of the compound forming element may be 5 wt % or higher. An alloy layer grows more and stronger jointing can be established when the content is higher than 5 wt %.

Tin of a liquid phase component remains and spreads on and wetting the carbon base during the heating when the jointing material and the carbon base are jointed to each other, and excellent jointing without any void is thereby established, by the fact that the content of the compound forming element of the jointing material is 30 wt % or lower.

It is preferred that the content of the compound forming element be 10 wt % or lower.

The residual of the jointing material may include only tin. In this case, when the jointing material includes one type of compound forming element, the jointing material is a binary alloy including one type of compound forming element and tin that is the main component.

The residual of the jointing material may include plural elements including tin that is the main component. In this case, the jointing material is a multi-component alloy including plural elements that includes the compound forming elements and tin that is the main component.

The content of the elements other than the elements each forming a compound with both of tin and carbon (the compound forming elements) and tin that is the main component is advantageously 0.01 wt % or lower and more advantageously 0.005 wt % or lower. It is preferred that the number of type of the element forming a compound with both of tin and carbon (the compound forming element) be one.

Light Emitting Element

For example, an ordinary gallium nitride diode can be used as the light emitting element. For example, an n-type gallium nitride and a P-type gallium nitride are formed on the top face of a sapphire substrate, and a P-type electrode and an N-type electrode are formed on the top face thereof to enable electric connection each using a wire. Metalizing (formation of a metal layer) connectable to the jointing material is conducted on the lower face of the sapphire substrate. The metalizing is to form gold to prevent any oxidation, after applying nickel. The metalizing only has to be any element that forms an alloy layer with tin of the jointing material.

Carbon Base

A base produced by forming carbon powder using a casting machine to be sintered is used as the carbon base. The carbon powder is aligned by molding, and the thermal conductivity coefficient in the thickness direction of the carbon base is 600 W/m·K and the thermal conductivity coefficient in the surface direction thereof is 200 W/m·K.

Process

A jointing article and the production method therefor according to the first embodiment will be described with reference to the drawings. FIG. 1A to FIG. 1F are schematic diagrams of steps of a fabrication method for a semiconductor device according to the first embodiment.

Figure 1B:
FIG. 1B is a schematic diagram of a step of the fabrication method for a semiconductor device according to the first embodiment.

(1) As depicted in FIG. 1A, a jointing material 101 and a carbon base 102 are first prepared, and are jointed to each other. The jointing conditions are as follows. The jointing material 101 and the carbon base 102 are placed in a furnace in a nitrogen atmosphere and are heated up to 1,200° C. at a temperature increase rate of 50° C./min. As depicted in FIG. 1B, a carbon jointing layer 103 is formed in the interface between the jointing material 101 and the carbon base 102. The carbon jointing layer 103 includes the compound forming element that forms a compound with each of tin and carbon, and is thereby firmly jointed.

Figure 1C:
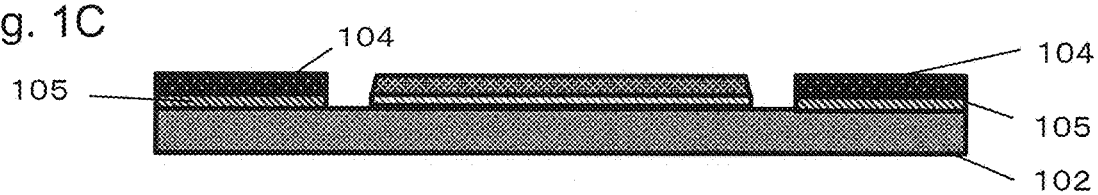
FIG. 1C is a schematic diagram of a step of the fabrication method for a semiconductor device according to the first embodiment.

(2) As depicted in FIG. 1C, an electrode layer 104 is formed. The electrode layer 104 is formed to establish electric connection for a light emitting element to be jointed thereto later. The electrode layer 104 is bonded to the carbon base 102 by a bonding layer 105 that has an insulation property.

Figure 1D:
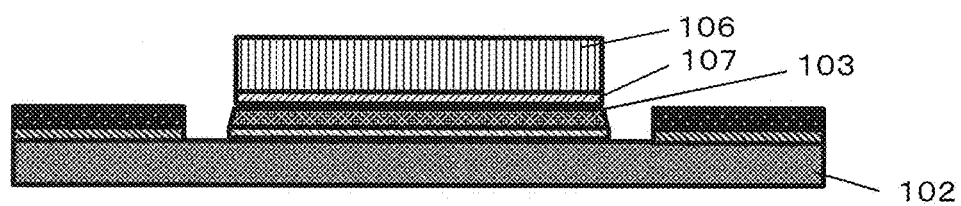
FIG. 1D is a schematic diagram of a step of the fabrication method for a semiconductor device according to the first embodiment.

(3) As depicted in FIG. 1D, the light emitting element 106 is jointed. The conditions for jointing the light emitting element 106 and the jointing material 101 to each other are as follows. The light emitting element 106 and the carbon base 102 in the state of FIG. 1C are placed in a furnace in a nitrogen atmosphere and are heated up to 350° C. at a temperature increase rate of 50° C./min. The pressure of the inside is reduced to 10 Pa or lower during the heating to remove voids and the pressure is thereafter recovered up to the atmospheric pressure to conduct cooling. The light emitting element 106 and the jointing material 101 are thereby jointed to each other.

A light emitting element jointing layer 107 of nickel·tin formed by a reaction between a nickel-gold layer formed by metalizing on the back face of the light emitting element 106 and tin of the jointing material 191 is formed in the interface between the jointing material 101 and the light emitting element 106 after the jointing.

Figure 1E:
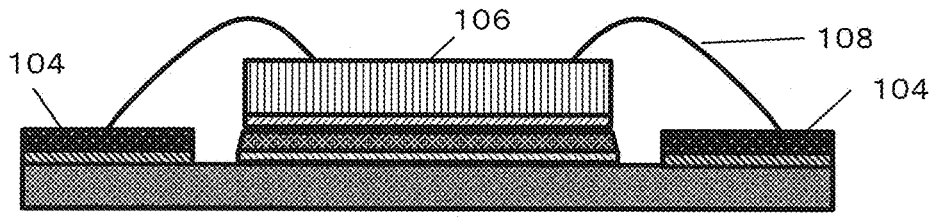
FIG. 1E is a schematic diagram of a step of the fabrication method for a semiconductor device according to the first embodiment.

(4) As depicted in FIG. 1E, the P-type electrode and the N-type electrode of the light emitting element 106 are connected to the electrode layer 104 by wires 108.

Figure 1F:
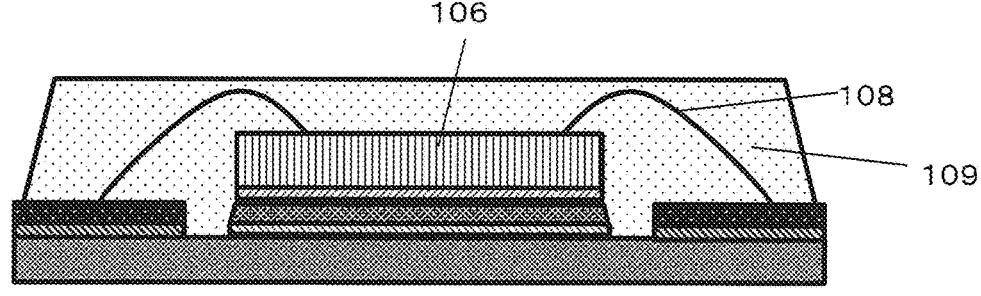
FIG. 1F is a schematic diagram of a step of the fabrication method for a semiconductor device according to the first embodiment.

(5) As depicted in FIG. 1F, the circumference of the light emitting element 106 is sealed by a sealing resin 109 to fabricate a semiconductor device 110.

EXAMPLES

The jointing material of this disclosure was produced as described in each of Examples 1 to 12 below. The production conditions and the evaluation results are shown in Table 2.

TABLE 2

| | Jointing Material | Compound Forming Element | Content of Compound Forming Element (wt %) | Temperature of Temperature Measuring Portion (° C.) | Judgment |
|---|---|---|---|---|---|
| Example 1 | SnTi alloy | Ti | 0.1 | 70 | ● |
| Example 2 | SnTi alloy | Ti | 1 | 75 | ● |
| Example 3 | SnTi alloy | Ti | 10 | 80 | ● |
| Example 4 | SnTi alloy | Ti | 15 | 89 | ○ |
| Example 5 | SnTi alloy | Ti | 30 | 97 | ○ |
| Example 6 | SnV alloy | V | 0.1 | 69 | ● |
| Example 7 | SnV alloy | V | 30 | 95 | ○ |
| Example 8 | SnZr alloy | Zr | 0.1 | 70 | ● |
| Example 9 | SnZr alloy | Zr | 30 | 96 | ○ |
| Comparative Example 1 | SnTi alloy | Ti | 0.01 | 200 | x |
| Comparative Example 2 | SnTi alloy | Ti | 35 | 121 | x |
| Comparative Example 3 | SnV alloy | V | 0.01 | 201 | x |
| Comparative Example 4 | SnV alloy | V | 35 | 119 | x |
| Comparative Example 5 | SnZr alloy | Zr | 0.01 | 199 | x |
| Comparative Example 6 | SnZr alloy | Zr | 35 | 115 | x |
| Comparative Example 7 | Ag paste | — | — | 201 | x |

Example 1

A tin-titanium alloy including titanium at 0.1 wt % and tin at 99.9 wt % as the residual was used as the jointing material 101. The jointing material 101 had a size of 1 mm×1 mm and a thickness of 0.2 mm as the shape of a molded article thereof. The carbon base 102 having a size of 4 mm×4 mm and a thickness of 1 mm was used.

The semiconductor device was fabricated as follows using the jointing material.

(1) The jointing material 101 was placed on the carbon base 102 to be heated to 1,200° C. in a furnace and to be cooled. The jointing material 101 was thereby jointed to the carbon base 102 by the carbon jointing layer 103.

(2) The electrode layer 104 was formed on the carbon base 102 through the jointing layer 105. The electrode layer included Cu to have a size of 1 mm×2 mm and the thickness: 0.05 mm.

(3) After forming the electrode layer 104, the light emitting element 106 having a size of 1 mm×1 mm and a thickness of 0.1 mm was put on the jointing material 101 to be heated at 350° C. in a furnace and to be cooled for the jointing to thereby be established.

(4) Electric connection was established by wiring the aluminum wires 108 between the light emitting element 106 and the electrode layer 104.

(5) The light emitting element 106 was thereafter sealed by the sealing resin 109 to fabricate the semiconductor device 110.

To check the heat dissipation property after the reliability test, the fabricated semiconductor device 110 was left untouched in a constant-temperature and constant-humidity bath at a temperature of 85° C. and a humidity of 85% for 3,000 hours.

Evaluation Method

Figure 2:
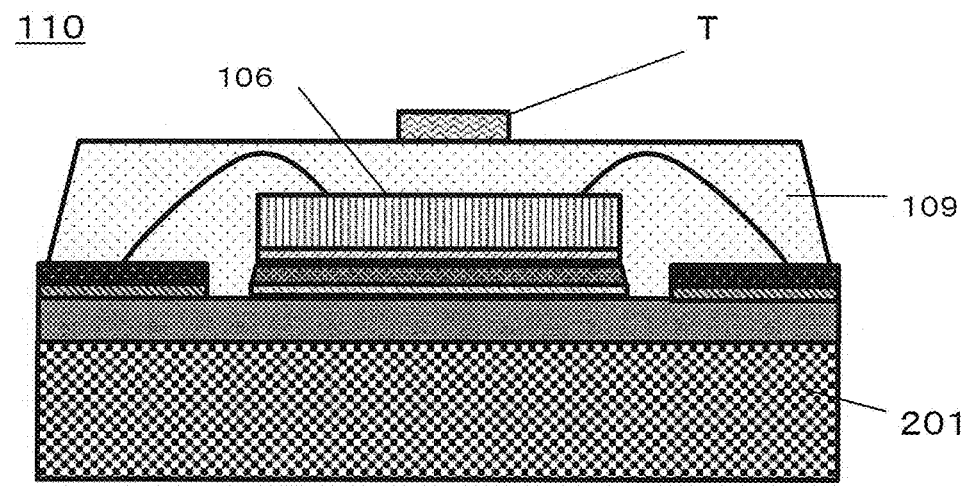
FIG. 2 is a schematic diagram of installation of a semiconductor device to a cooling plate.
Figure 3:
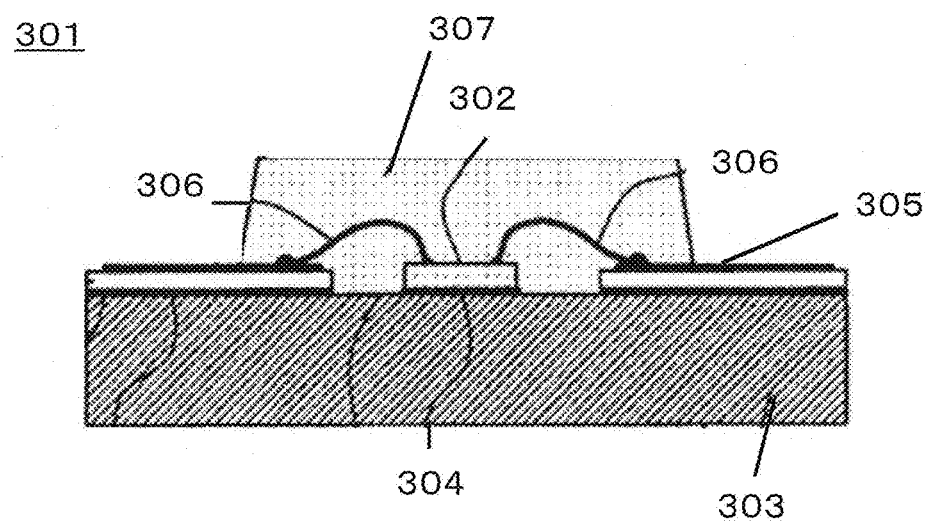
FIG. 3 is a schematic diagram of a traditional light emitting device.

As depicted in FIG. 2, a cooling plate 201 was thereafter installed beneath the semiconductor device 110 and the light was caused to be emitted by energization. A thermocouple was installed in a temperature measuring portion T on the surface of the sealing resin 109 in the upper portion of the light emitting element 106 to conduct the temperature measurement.

It can be seen that the heat did not escape from the lower face of the light emitting element 106 and was accumulated when the temperature of the surface of the sealing resin 109 was high.

Example 2

A tin-titanium alloy including titanium at 1 wt % and tin at 99 wt % as the residual was used as the jointing material 101. A semiconductor device was fabricated in the same manner as that of Example 1 for the conditions except the above, and was left untouched in a constant-temperature and constant-humidity bath at a temperature of 85° C. and a humidity of 85% for 3,000 hours to thereafter measure the temperature.

Example 3

A tin-titanium alloy including titanium at 10 wt % and tin at 90 wt % as the residual was used as the jointing material 101. A semiconductor device was fabricated in the same manner as that of Example 1 for the conditions except the above, and was left untouched in a constant-temperature and constant-humidity bath at a temperature of 85° C. and a humidity of 85% for 3,000 hours to thereafter measure the temperature.

Example 4

A tin-titanium alloy including titanium at 15 wt % and tin 85 wt % as the residual was used as the jointing material 101. A semiconductor device was fabricated in the same manner as that of Example 1 for the conditions except the above, and was left untouched in a constant-temperature and constant-humidity bath at a temperature of 85° C. and a humidity of 85% for 3,000 hours to thereafter measure the temperature.

Example 5

A tin-titanium alloy including titanium at 30 wt % and tin 70 wt % as the residual was used as the jointing material 101. A semiconductor device was fabricated in the same manner as that of Example 1 for the conditions except the above, and was left untouched in a constant-temperature and constant-humidity bath at a temperature of 85° C. and a humidity of 85% for 3,000 hours to thereafter measure the temperature.

Example 6

A tin-vanadium alloy including vanadium at 0.1 wt % and tin at 99.9 wt % as the residual was used as the jointing material 101. A semiconductor device was fabricated in the same manner as that of Example 1 for the conditions except the above, and was left untouched in a constant-temperature and constant-humidity bath at a temperature of 85° C. and a humidity of 85% for 3,000 hours to thereafter measure the temperature.

Example 7

A tin-vanadium alloy including vanadium at 30 wt % and tin at 70 wt % as the residual was used as the jointing material 101. A semiconductor device was fabricated in the same manner as that of Example 1 for the conditions except the above, and was left untouched in a constant-temperature and constant-humidity bath at a temperature of 85° C. and a humidity of 85% for 3,000 hours to thereafter measure the temperature.

Example 8

A tin-zirconium alloy including zirconium at 0.1 wt % and tin at 99.9 wt % as the residual was used as the jointing material 101. A semiconductor device was fabricated in the same manner as that of Example 1 for the conditions except the above, and was left untouched in a constant-temperature and constant-humidity bath at a temperature of 85° C. and a humidity of 85% for 3,000 hours to thereafter measure the temperature.

Example 9

A tin-zirconium alloy including zirconium at 30 wt % and tin 70 wt % as the residual was used as the jointing material 101. A semiconductor device was fabricated in the same manner as that of Example 1 for the conditions except the above, and was left untouched in a constant-temperature and constant-humidity bath at a temperature of 85° C. and a humidity of 85% for 3,000 hours to thereafter measure the temperature.

Comparative Example 1

A tin-titanium alloy including titanium at 0.01 wt % and tin 99.99 wt % as the residual was used as the jointing material. A semiconductor device was fabricated in the same manner as that of Example 1 for the conditions except the above, and was left untouched in a constant-temperature and constant-humidity bath at a temperature of 85° C. and a humidity of 85% for 3,000 hours to thereafter measure the temperature.

Comparative Example 2

A tin-titanium alloy including titanium at 35 wt % and tin 65 wt % as the residual was used as the jointing material. A semiconductor device was fabricated in the same manner as that of Example 1 for the conditions except the above, and was left untouched in a constant-temperature and constant-humidity bath at a temperature of 85° C. and a humidity of 85% for 3,000 hours to thereafter measure the temperature.

Comparative Example 3

A tin-vanadium alloy including vanadium at 0.01 wt % and tin at 99.99 wt % as the residual was used as the jointing material. A semiconductor device was fabricated in the same manner as that of Example 1 for the conditions except the above, and was left untouched in a constant-temperature and constant-humidity bath at a temperature of 85° C. and a humidity of 85% for 3,000 hours to thereafter measure the temperature.

Comparative Example 4

A tin-vanadium alloy including vanadium at 35 wt % and tin at 65 wt % as the residual was used as the jointing material. A semiconductor device was fabricated in the same manner as that of Example 1 for the conditions except the above, and was left untouched in a constant-temperature and constant-humidity bath at a temperature of 85° C. and a humidity of 85% for 3,000 hours to thereafter measure the temperature.

Comparative Example 5

A tin-zirconium alloy including zirconium at 0.01 wt % and tin at 99.99 wt % as the residual was used as the jointing material. A semiconductor device was fabricated in the same manner as that of Example 1 for the conditions except the above, and was left untouched in a constant-temperature and constant-humidity bath at a temperature of 85° C. and a humidity of 85% for 3,000 hours to thereafter measure the temperature.

Comparative Example 6

A tin-zirconium alloy including zirconium at 35 wt % and tin 65 wt % as the residual was used as the jointing material. A semiconductor device was fabricated in the same manner as that of Example 1 for the conditions except the above, and was left untouched in a constant-temperature and constant-humidity bath at a temperature of 85° C. and a humidity of 85% for 3,000 hours to thereafter measure the temperature.

Comparative Example 7

A silver paste was used as the jointing material. A carbon base having a size of 4 mm×4 mm and a thickness of 1 mm was used as the carbon base 102.
(1) The silver paste was applied to have a thickness of 0.1 mm and a size of 1×1 to the carbon base 102, and a light emitting element was placed on the applied silver paste for the applied silver paste to be hardened in the atmospheric air at 100° C. for 1 hour for bonding therebetween to be established.

(2) An electrode layer was formed on the carbon base through a bonding layer. The electrode layer was Cu and was set to have a size of 1 mm×2 mm and a thickness: 0.05 mm.

(3) Electric connection was established between the light emitting element and the electrode layer by wiring aluminum wires therebetween.

(4) The light emitting element was thereafter sealed using the sealing resin to fabricate a semiconductor device.

To check the heat dissipation property after the reliability test, the fabricated semiconductor device was left untouched in a constant-temperature and constant-humidity bath at a temperature of 85° C. and a humidity of 85% for 3,000 hours to measure the temperature at the same point as that of Example 1.

Results and Consideration

Table 2 shows the fabrication conditions, the temperature measurement result of the surface of the sealing resin 109, and the judgment result for each of Examples 1 to 9 and Comparative Examples 1 to 6.

The judgment result of the temperature of the surface of the sealing resin 109 was determined as follows. When the temperature of the surface of the sealing resin 109 was 80° C. or lower, it was judged as "●", because degradation of the light emission luminance was very little. When the temperature of the surface of the sealing resin 109 was higher than 80° C. to 100° C. or lower, it was judged as "○", because degradation of the light emission luminance was little. When the temperature of the surface of the sealing resin 109 was higher than 100° C., it was judged as "x", because degradation of the light emission luminance was conspicuous.

For Examples 1 to 3, the temperatures of the surface of the sealing resin 109 were 70° C., 75° C., and 80° C. to be low temperatures and the judgment for each thereof was "●". It is estimated for this as follows. It can be considered that a tin-titanium-carbon compound was first formed as the carbon jointing layer 103 in the interface between the carbon base 102 and the joining material, and a nickel-tin compound was also formed as the light emitting element jointing layer 107 in the interface between the light emitting element 106 and the jointing material 101. It can be estimated that the heat-transfer resistance in the interface was therefore reduced different from that of bonding, the heat of the light emitting element 106 was able to efficiently be transferred to the carbon base 102, and the heat was caused to escape from the carbon base 102 having a high thermal conductivity coefficient to the cooling plate 201.

For Examples 4 and 5, the temperatures of the surface of the sealing resin 109 were 89° C. and 97° C., and were 100° C. or lower, and the judgment for each thereof was "○". In this case, the heat was also caused to escape similar to the above while, it can be considered that the cooling performance was somewhat degraded compared to those of Examples 1 to 3 because the content of titanium having the thermal conductivity coefficient of 20 W/m·K compared to the thermal conductivity coefficient of 50 W/m·K of tin, was increased.

For Examples 6 and 8 respectively using vanadium and zirconium each as the compound forming element, similarly, the temperatures of the surface of the sealing resin 109 were 69° C. and 70° C. to be low temperatures and the judgment for each thereof was "○". For Examples 7 and 9, the temperatures of the surface of the sealing resin 109 were 95° C. and 96° C. and were 100° C. or lower, and the judgment for each thereof was "●".

Similar to the case where titanium was added as the compound forming element, it can be seen for these results that the formation of the compound caused the heat to efficiently escape to the carbon base 102. On the other hand, it can be estimated that vanadium had the thermal conductivity coefficient of 30 W/m·K and zirconium had the thermal conductivity coefficient of 22.6 W/m·K, and the thermal conductivity coefficient of the jointing layer was reduced when the addition amounts thereof were each increased and the temperatures were each somewhat increased.

For Comparative Examples 1 to 7, the temperatures of the surface of the sealing resin 109 were all 100° C. or higher and the judgment for each thereof was "x". For Comparative Examples 1, 3, and 5, the content of each of titanium, vanadium, and zirconium to be the compound forming elements was 0.01 wt % to be little and it can be estimated that no compound layer was formed in the interface between the carbon base and the jointing material, and any heat transmission was therefore unable to take place resulting in the increase of the temperatures.

For Comparative Examples 2 and 4, the content of each of titanium, vanadium, and zirconium to be the compound forming elements was 30 wt % to be much, the jointing material was therefore not completely melted when the jointing of the light emitting element was conducted, and the voids were not removed for gaps to remain in the jointing layer. It can be estimated that these gaps acted as heat-transfer resistors resulting in no reduction of the temperature.

The state of the jointing layer was not varied even after 3,000 hours in the constant-temperature and constant-humidity bath at the temperature of 85° C. and the humidity of 85% in each of Examples 1 to 9 and Comparative Examples 1 to 6. The side face of the jointing material was analyzed and titanium, vanadium, and zirconium to be the compound forming elements were incrassated as oxides at about 100 nm in the surface layer of the side face. It can be estimated that titanium, vanadium, and zirconium each more easily forming an oxide than tin moved to the surface in which titanium, vanadium, and zirconium were brought into contact with oxygen, by adding titanium, vanadium, and zirconium (the configuration according to a second aspect), and oxides thereof were each formed as a robust oxide layer, and entrance of any oxygen was suppressed into the inside in an amount exceeding a specific amount.

In Comparative Example 7, because the silver paste was used as the jointing material, oxygen and steam entered the inside of the resin by leaving the semiconductor device untouched for 3,000 hours in the constant-temperature and constant-humidity bath at the temperature of 85° C. and the humidity of 85%, the resin was thereby degraded, and gaps were generated therein. The thermal conductivity coefficient was therefore reduced resulting in an increase of the temperature, and the judgment thereof was "x".

From these results, it can be seen that an alloy including the compound forming element at 0.1 wt % to 30 wt % and tin at 70 wt % to 99.9 wt % as the residual as its main component is advantageously used as the jointing material. It is preferred that a graphite base and the light emitting element be jointed to each other using this jointing material to fabricate a semiconductor device. The compound forming element of the jointing material is incrassated as an oxide in the interface of the sealing resin of the side face during the leaving untouched at the constant temperature and the constant humidity, the oxide thereby functions as a passive state to suppress advancement of any oxidation, and high reliability can be secured.

From the results of Examples 1 to 3, it is preferred that the concentration of the compound forming element be 0.1 wt % to 10 wt %. This applies to not only Ti but also V and Zr. This is because Ti, V, and Zr each have lower thermal conductivity than that of Sn and, when a large amount of each thereof is added, the thermal property is degraded.

This disclosure includes properly combining any optional embodiments and/or Examples with each other of the above various embodiments and/or Examples, and the effects to be achieved by the combined embodiments and/or Examples can be achieved.

A semiconductor device including a light emitting element and a carbon base that are jointed to each other by the jointing material according to the present invention can secure a high heat dissipation property and high reliability and is usable for a driving current for high luminance.

EXPLANATIONS OF LETTERS OR NUMBERS 101 jointing material
102 carbon base
103 carbon jointing layer
104 electrode layer
105 bonding layer
106 light emitting element
107 light emitting element jointing layer
108 wire
109 sealing resin
110 semiconductor device
201 cooling plate
301 semiconductor device
302 light emitting element
303 base
304 silver paste
305 electrode
306 wire
307 sealing resin

The invention claimed is:

1. A structure comprising:
a light emitting element including a metal layer;
a carbon member including carbon; and
a jointing material consisting of:
    a one type of element at 0.1 wt % to 10 wt %; and
    a remainder of tin,
wherein
the jointing material is a binary alloy,
the one type of element is titanium, and
the structure has a first layer formed by the tin, the carbon member, and the titanium between the carbon member and the joining material, and a second layer formed by the metal layer and the tin between the metal layer and the jointing material.

2. A fabrication method for a semiconductor device, comprising:
providing a jointing material
jointing a carbon base and the jointing material at 1200° C.; and
jointing a metal layer and the jointing material at 350° C. to fabricate the semiconductor device
wherein the jointing material consists of a one type of element at 0.1 wt % to 10 wt % and a remainder of tin,
the jointing material is a binary alloy, and
the one type of element is titanium.

3. A semiconductor device comprising:
the structure according to claim 1,
wherein
the carbon member is a carbon base, and
the jointing material joints the light emitting element and the carbon base to each other.

4. The structure according to claim 1, wherein a content of the one type of element is higher than 5 wt % and less than or equal to 10 wt %.

5. A structure comprising:
a light emitting element including a metal layer;
a carbon member including carbon; and
a jointing material consisting of:
    a one type of element at 0.1 wt % to 10 wt %; and
    a remainder of tin,
wherein the jointing material is a binary alloy,
the one type of element is zirconium, and
the structure has a first layer formed by the tin, the carbon member, and zirconium between the carbon member and the joining material, and a second layer formed by the metal layer and the tin between the metal layer and the jointing material.

6. A structure comprising:
a light emitting element including a metal layer;
a carbon member including carbon; and
a jointing material consisting of:
    a one type of element at 0.1 wt % to 10 wt %; and
    a remainder of tin,
wherein the jointing material is a binary alloy,
the one type of element is vanadium, and
the structure has a first layer formed by the tin, the carbon member, and vanadium between the carbon member and the joining material, and a second layer formed by the metal layer and the tin between the metal layer and the jointing material.

7. The structure according to claim 5, wherein a content of the one type of element is higher than 5 wt % and less than or equal to 10 wt %.

8. The structure according to claim 6, wherein a content of the one type of element is higher than 5 wt % and less than or equal to 10 wt %.

* * * * *